United States Patent
Hoffmeyer

(10) Patent No.: US 6,711,026 B2
(45) Date of Patent: Mar. 23, 2004

(54) SASH FOR LAND GRID ARRAYS

(75) Inventor: Mark Kenneth Hoffmeyer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/007,986

(22) Filed: Nov. 13, 2001

(65) Prior Publication Data

US 2003/0089523 A1 May 15, 2003

(51) Int. Cl.$^7$ ................................................. H05K 1/18
(52) U.S. Cl. ........................ 361/778; 361/772; 439/71
(58) Field of Search ............................... 361/772–774, 361/778–779, 803; 439/66, 71

(56) References Cited

U.S. PATENT DOCUMENTS

| | | | | |
|---|---|---|---|---|
| 5,199,889 A | * | 4/1993 | McDevitt, Jr. | 439/66 |
| 5,232,372 A | * | 8/1993 | Bradley et al. | 439/66 |
| 5,473,510 A | * | 12/1995 | Dozier, II | 361/719 |
| 5,653,600 A | * | 8/1997 | Ollivier | 439/73 |
| 5,820,389 A | * | 10/1998 | Hashiguchi | 439/66 |
| 5,919,050 A | * | 7/1999 | Kehley et al. | 439/71 |
| 5,967,797 A | * | 10/1999 | Maldonado | 439/66 |
| 6,042,412 A | * | 3/2000 | Murr | 439/331 |
| 6,442,045 B1 | * | 8/2002 | Goodwin et al. | 361/816 |

OTHER PUBLICATIONS

U.S. patent application Ser. No. 09/852,998 filed May 10, 2001 entitled *Land Grid Array (LGA) Pad Repair Structure and Method* by Ma et al.

U.S. patent application Ser. No. unknown filed Aug. 22, 2001 entitled *LGA Connector with Integrated Gasket* by Hoffmeyer, IBM Docket No. ROC92000021US1.

Tummala and Rymaszewski (eds.), *Microelectronics Packaging Handbook*, Van Nostrand Reinhold, New York, 1989, Chapter 12 pp. 853–919.

\* cited by examiner

Primary Examiner—Kamand Cuneo
Assistant Examiner—Tuan Dinh
(74) Attorney, Agent, or Firm—Karuna Ojanen

(57) ABSTRACT

A conductive sash is etched around the periphery of a land grid array interconnection on a carrier for dense integrated circuit connections. If the array comprises more than one module or module chip domain, the conductive sash is also positioned between the modules. The dimensions of the sash are such that it is slightly larger than a frame of an interposer or other electrical connector which is placed upon the array. In this fashion, the interposer or other electrical connector rests upon the sash and provides protection against particulate and gaseous contamination of the array. Preferably, the sash is manufactured along with the array of electrical interconnections of the carrier, and during the manufacture the sash provides more homogeneous current density to the outer interconnections of the array during component processing which in turn provides more predictable and consistent surface topography of the carrier and permits more uniform mechanical loading of the interposer or other connector onto the array when assembled.

7 Claims, 2 Drawing Sheets

SASH FOR LAND GRID ARRAYS

FIELD OF THE INVENTION

This invention relates generally to the field of electrical connections for integrated circuits and more particularly relates to the field of land grid array electrical connections.

BACKGROUND OF THE INVENTION

In the world of integrated circuits, there are a multitude of electrical connections between the integrated circuits and other integrated circuits and eventually to the "outside world." As integrated circuits become more dense, so must the electrical connections. Integrated circuits are mounted on printed circuit boards and printed-wiring technology is the current method to build circuit-boards having embedded circuit traces. These traces are interconnected with vias/microvias which connects one trace on one circuit-board layer to a trace on a different layer. These vias/microvias, however, degrade the continuity of a signal path introducing variations in the electrostatic and electromagnetic qualities of the via transition. Varying and controlling the physics of each connection by controlling the dielectric used, the dielectric thickness, and the area of the signal path can result in a specific, controlled characteristic impedance. Ideally, any portion of any high-density high-speed device should be equally accessed and interconnected with homogenous, impedance-controlled connections to improve signal fidelity with less reflection and reduced electromagnetic interference. Shielding can be added around the outer portions of the wire to shield against electromagnetic field radiation. There are a myriad of options to provide the electrical connections to/from integrated circuits with these considerations incorporated into the design, such as various small outline packages, plastic leaded chip carrier, dual inline packages, pin grid arrays, ball grid arrays, etc.

The next generation of integrated circuits such as system-on-chip and other high-density devices, however, require high density electrical interconnections. Current limitations of printed-wiring boards have trace widths as small as 0.003 inch. While fine, high-density circuit traces increase the density of a interconnect they also increase the inductance, resistance, and current-carrying ability of the interconnect. High-speed, high-density circuit board can be difficult to design when evenly distributed minimum strip-line layers having minimum vias are required. In addition, circuit boards for high-speed, high density having exacting requirements can be expensive to manufacture. Previous packaging options, like pin grid arrays and quad flat packs all left something to be desired in achieving these goals. Even with fine line techniques, larger printed circuit board designs have difficulty reaching the inner portions of high-density devices with homogenous, impedance-controlled connections.

An emerging technology that is becoming increasingly popular is to package the high density, high speed integrated devices without any terminations on the bottom. Such packages are referred to as Land Grid Arrays (LGA). Although not technically accurate, the easiest way to envision an LGA device is to picture a semiconductor with nothing but tiny round gold plated pads on the bottom whereas if the device were a ball grid array, a ball would be soldered to each pad. The biggest reason for terminating a device as an LGA is to achieve higher pin counts (number of outputs) with smaller packages. With new requirements such as high-end printed circuit boards requiring 1000 and more pin counts, even the ball grid array is not an option because the large footprints can not stand the forces on the solder joints that are caused by thermal mismatch, i.e., the materials of the semiconductor device have different coefficients of expansion than those of the target printed circuit board. A "z-axis" connection of the LGA can overcome the thermal mismatch problems.

Land grid arrays offer high interconnection density, e.g., at a one millimeter pitch, a 35×35 grid may contain 1,225 interconnections in a space less than 1.5 square inches and 2,025 interconnections in a 45×45 grid less than 1.75 square inches. Land grid array modules are easy to manufacture and the cost of module production is must less because terminations such as pins or balls are no longer required. Recall that it is very important to keep the electrical path of each connection as short as possible for low inductance and the LGA achieves this with a distance from the bottom of the device being socketed to the target board of less than two millimeters with some LGA socket designs. Co-planarity problems are reduced in many instances because LGA sockets can be manufactured for spring movement of 0.015" (0.4 mm) which "takes up the slack" when there is a problem with co-planarity on the bottom of the device. LGAs also have low mating force requirements, in some instances requiring only 20 to 35 grams of force per position to achieve reliable mating. When using land grid arrays, moreover, microprocessors can be easily removed and replaced.

As discussed above almost all LGA interconnections require a LGA connector element where controlled loads are applied to this element using some form of mechanical hardware. Examples of a connector is an interposer or socket component; something that possesses the specific LGA pattern of exposed contacts on top and bottom faces of the connector and mates to corresponding module and board surfaces to be interconnected. To ensure reliable LGA interconnection performance, both contact members in the interposer and mating surfaces of boards and module LGA contact pads must possess a noble surface finish that is both resistant to corrosion and provides low contact resistance within the contact load range necessary for mating of the connector. To provide these attributes on printed circuit boards, LGA contact pads are usually plated with a nickel/gold (Ni/Au) surface finish. In many applications, including some backplane applications, these surfaces must be plated by selective deposition of electrolytic Ni/Au platings as opposed to use of electroless or immersion platings.

Although the use of electrolytic Ni/Au plating provides desirable surface nobility, deposition thickness of the electrolytic platings and particularity the nickel underplating can be quite variable across an LGA site, greater than 0.001" to 0.002" on large LGA areas used on some backplanes. The variation of the Ni/Au electrolytic plating thickness typically results from current density variation on specific etched metal surface features of a board; typically higher current densities are more isolated from the bulk of etched surface features. Higher current density causes thicker Ni/Au platings while areas with more surrounding metal surface area have more balanced current density and plate near desired nominal thickness conditions. Indeed, high Ni/Au thickness is observed on exposed outer perimeter row and corner pads of LGA areas on printed circuit boards. Thickness variability observed on multiple LGA printed circuit products is as much as 0.002", and in severe cases, can exceed 0.004". This variation ultimately creates significant contact load variation on LGA interposers used to interconnect modules to board surfaces because the pad thickness variation may use up ⅔ of a typical working tolerance of 0.006". The variable load impedes the ability to design LGA interconnections and loading systems that enable contact formation within a recommended load point range for specific LGA connector technologies to ensure long term contact reliability. Moreover, high points on cards resulting from added plating thickness and plating variability are more sensitive to handling or abrasion damage.

In addition to these issues of contact load variability from inconsistent board plating thickness and sensitivity to plating surface damage are other concerns of potential for degradation of contact surfaces in corrosive environments and sensitivity of board contact surfaces to particulate contamination that can interfere or degrade LGA connector contact function as well.

There is thus a need in the industry to provide a land grid array electrical interconnection that provides more homogeneous and more consistent electrical contacts while protecting the land grid array and the interconnection environment from corrosion resulting from factors such as mechanical friction, unwanted particles, and corrosion.

SUMMARY OF THE INVENTION

These objects are thus satisfied by a land grid array on a carrier, the land grid array having a plurality of electrical interconnections having a sash surrounding the perimeter of the land grid array. The height of the sash preferably is the same heights as the electrical interconnections extending above the plane of the carrier. The sash may have a noble or semi-noble surface finish plating; the plating may be a pure metal or an alloy from the group consisting of Ni, Au, or palladium. The sash may be conductive and of the same material as the plurality of electrical interconnections. If the sash is conductive, it may be electrically connected to a logic ground voltage, or another voltage. Indeed, the sash may be manufactured and processed simultaneously with the manufacturing and processing of the electrical interconnections.

The outer perimeter of the conductive sash may be slightly larger than the outer periphery of a frame of an electrical interposer connector to be aligned onto the land grid array. If the array is one for a multichip module, the sash may comprise at least one interior sash surrounding each of a plurality of electrical interconnections specific to one of several individual chip domains residing on the multichip module. The sash may have a plurality of electrical connections connecting it to selected ones of the plurality of electrical interconnections.

The invention may also be considered a land grid array on a carrier, comprising: a plurality of electrical interconnections arranged into an array; an electrically conductive sash surrounding the perimeter of the array, the sash having a width defined by an inner edge closest to the array and an outer edge, the width of the sash larger than a frame having a mating connector to be positioned onto the array, the height of the sash being the same height as the electrical connections; and a plurality of electrical connections between the sash and array at selected electrical connections.

The invention is further considered a carrier with a land grid array for use with a land grid array interposer connector, the land grid array having of multitude of electrical interconnections, comprising: placement means for an interposer to rest upon when placed upon the array; means to provide a more uniform height and surface finish of the electrical interconnections spanning interior regions of the area toward the outer periphery of the array where the interposer is placed upon the placement means; and means to prevent particulate and gaseous contamination of the array of electrical connections when an interposer is placed onto the array. The placement means, the uniform height and surface means, and the prevention means may be an electrically conductive sash of the same material as the electrical connections surrounding the periphery of the array.

BRIEF DESCRIPTION OF THE DRAWING

These advantages and other features of the invention are realized by reading the description of the invention in conjunction with the Drawing of Invention, wherein.

DESCRIPTION OF THE INVENTION

Figure 1:
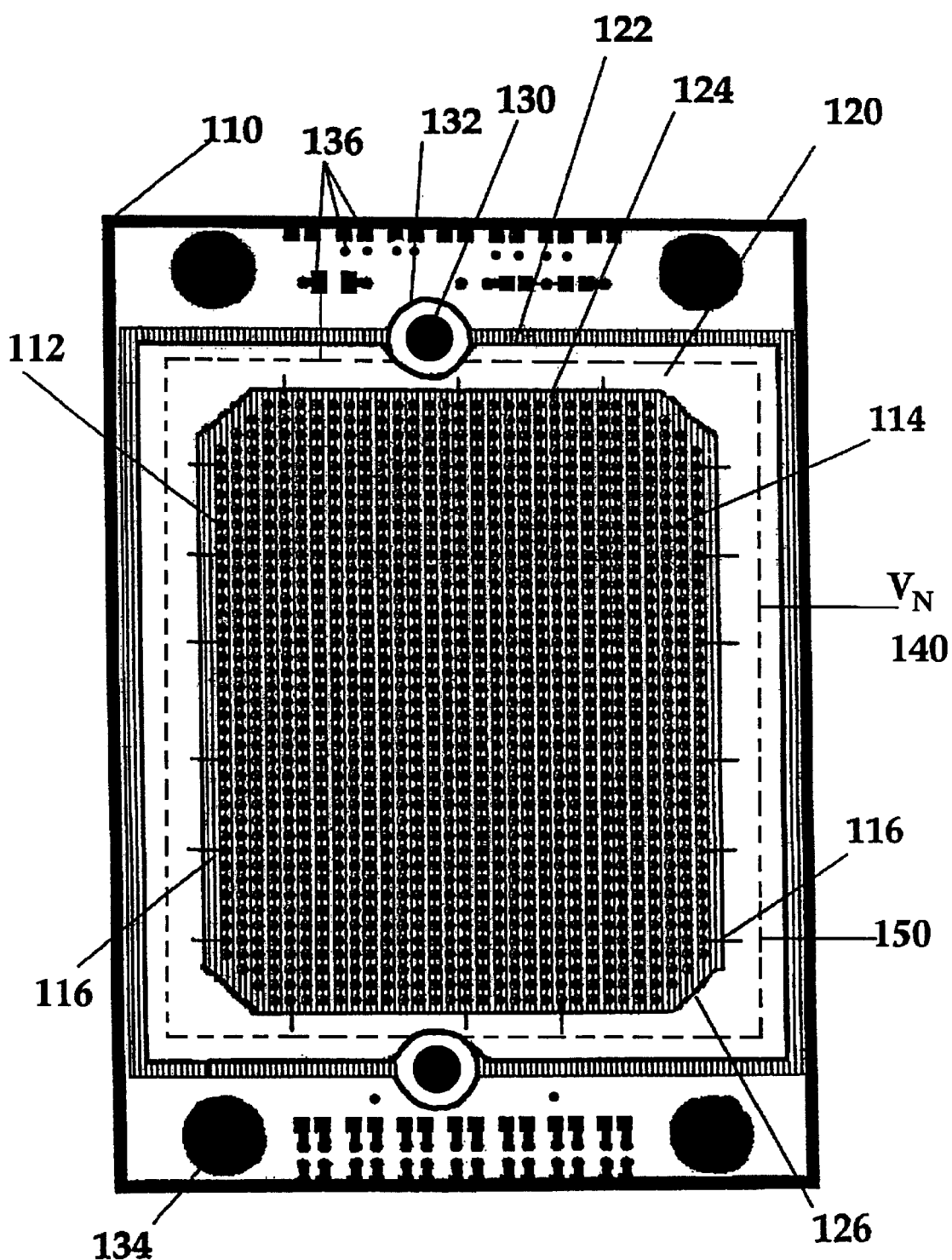
FIG. 1 is an illustration of a land grid array having a sash in accordance with an embodiment of the invention.

To address the aforementioned concerns, a sash is etched at the periphery of the plated LGA contact area on a carrier. The carrier may be a printed circuit board, a ceramic module, flex circuitry, an organic package, indeed, anything that carries electrical wires and interconnection pads. With respect to FIG. 1, there is shown a land grid array 110. The land grid array 110 is a rectangular array 112 of 1,247 electrical connections 114 arranged in 31 columns and 41 rows, although the arrangement could be in a square, a cube, a circle, a sphere, single row, or any other two or three-dimensional shape to accommodate electrical interconnections. The number of electrical connections, moreover, is variable with as many as 7,000 anticipated soon. The electrical interconnections extend above the surface plane of the carrier slightly in order to provide electrical contact. Each interconnection 114 provides a conductive electrical contact upon which an integrated circuit (not shown) will be mounted. Surrounding the periphery of the array 112 is a sash 120, preferably made from the same conductive materials as the interconnections 114.

In the illustration of FIG. 1, the width of the sash 120 is approximately equal to four to five rows of the interconnections 114. The sash 120 has an inner edge 124 closest to the array 112 of interconnections 114 and an outer perimeter 122. The dimensions of the sash 120 are such that it provides a meeting and resting area for the frame of an interposer 150, the outline of which is represented as a dashed line on FIG. 1, that will be placed on the land grid array 112 during interconnection. Preferably, the height of the sash 120 is substantially the same height as the electrical interconnections 114 in order to provide a firm contact and yet seal the array. Note that near the corners of the array 112, the sash 120 is angled 126 to provide smoother coverage and fewer asymptotic electrical fields around the corners. It has been empirically determined that the width of the sash would be at least sufficient to prevent the variations of current density occurring at the electrical interconnections 114 during deposition, i.e., creation of the electrical interconnections.

Electrical connections 116 may be provided intermittently at the periphery of the array 112 to electrically connect the sash 120 to a logic ground or other electrical interconnection 114. This feature is optional but is preferred in that the sash 120 may be electrically tied to a voltage $V_N$ 140 which may be at the frame voltage or printed circuit card ground voltage or some other voltages. The electrical connections 116 thus provide a redundant and low impedance connection to the sash. These redundance intermittent electrical connections 116 also offer some advantageous repair features when similar designs are incorporated onto the non-contact side of the carrier having the LGA, as disclosed in U.S. patent application Ser. No. 09/852,998 entitled Land Grid Array (LGA) Pad Repair Structure and Method filed on May 10, 2001, owned by a common assignee, and herein incorporated by reference in its entirety. Although shown in the figures as extending towards and connecting the electrical interconnections 114 to the sash 120, the electrical connections 116 may actually extend in another direction to electrically connect capacitors or other circuit devices 136 included on the carrier to a bias or voltage other than that of the electrical interconnections 114. These electrical connections 116 thus may provide electrical design flexibility for interconnection and grounding schemes of housings or other components as well.

Holes 130 may be used to align the LGA connector onto the circuit board and electrically connect the circuit board to a frame ground. If the holes 130 are connected to a different voltage than the sash 120, such as frame ground, an insulating area 132 may circumscribe the hole 130 to electrically separate it from the sash 120 and/or other voltages. Metal pins used for alignment can also connect the LGA connector to a heat sink (not shown). Other tooling holes 134 may accommodate load posts, the interposer, and any actuation hardware used to apply the load to LGA. Other paths of discrete components 136 may be used for test paths or for capacitors.

Figure 2:
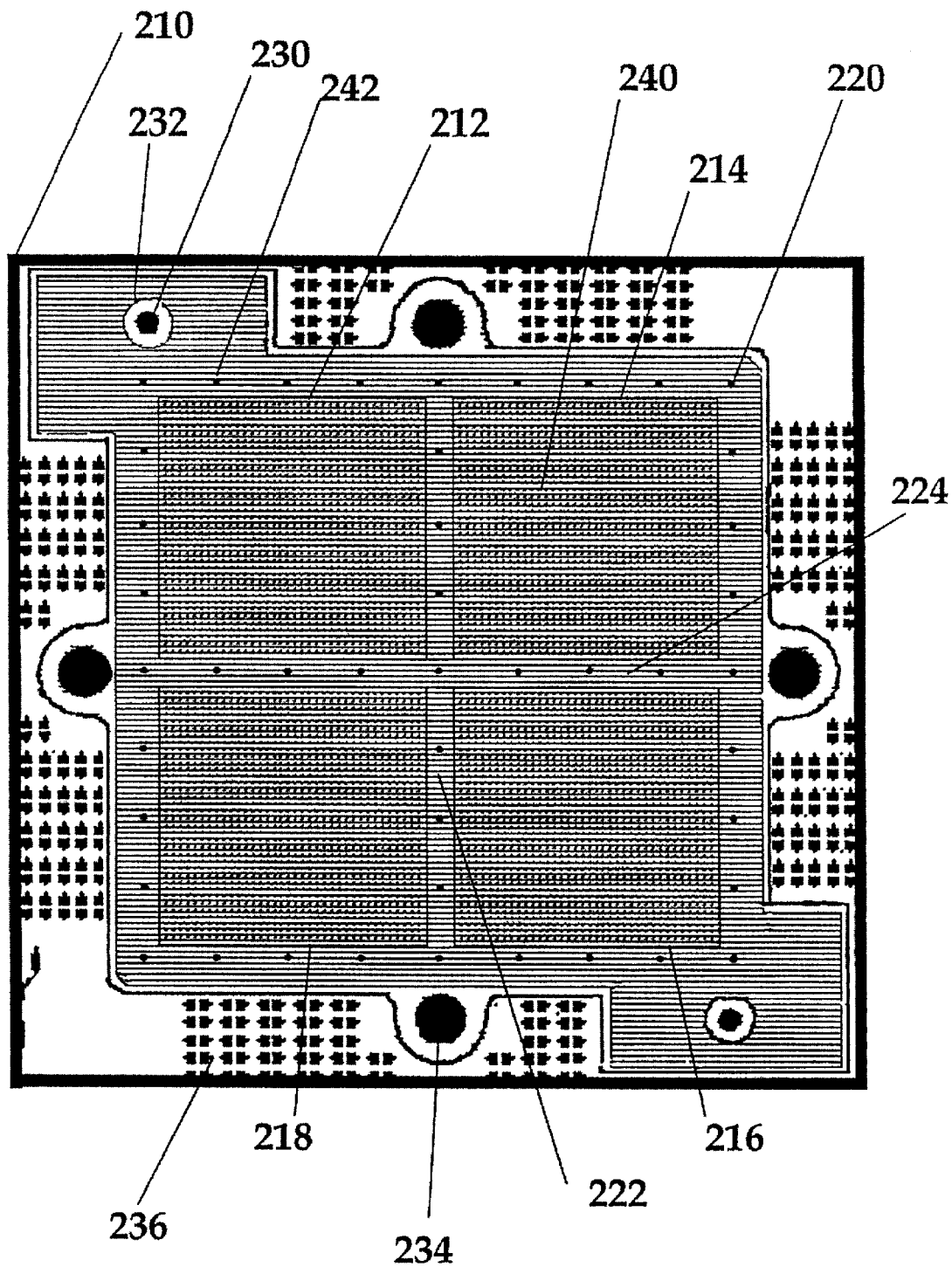
FIG. 2 is an illustration of an alternative land grid array having a sash in accordance with another embodiment of the invention. It is suggested that FIG. 2 be printed on the face of the patent.

FIG. 2 illustrates a multichip module 210 having four quadrants: 212, 214, 216, and 218 wherein each quadrant is separated from another quadrant by an interior sash 222, preferably conductive, which may intersect with another interior sash 224, also preferably conductive. Each quadrant may represent an individual chip domain of a multichip module. There are over 5,000 electrical connections 240 shown in the multichip module 210 upon which a matching interposer may be loaded to provide electrical continuity. Of course, there may be a conductive perimeter sash 220 surrounding the multichip module 210. Similarly to the single chip module 110 of FIG. 1, intermittent electrical via connections 242 within and through the sashes 220, 222, and 224 provide a redundant and low impedance path from the sash to a voltage, preferably logic ground, but not necessarily the same voltage as the interconnections if the connections 242 are isolated from the land grid array. These connections 242 are also useful for repair techniques as described in the patent application Ser. No. 09/852,998 referenced above. The sash 220 may extend on at least one corner to surround alignment hole 230 and an electrically insulating region 232 circumscribing the alignment hole. Alignment holes 230 may be electrically tied to a frame ground or other voltage different from the sash 220 and would be electrically insulated by region 232. Load posts may be inserted in holes 234 which will properly align and load an interposer (not shown) onto the array 210. Similarly, paths for other discrete components and/or capacitors 236 may be provided outside the sash 220.

Numerous advantages result from having the conductive sash surrounding the LGA. The enhanced uniformity of the plating thickness resulting on LGA contact pads when the sash is present eliminates local high spots on the interconnection pads normally subject to abrasion damage during printed circuit board handling and post processing of the printed circuit boards. Thus, the sash can receive the brunt of mechanical damage during handling and transport of the board. Because the sashes surrounding the perimeter and/or interior regions of LGA interconnection pads are substantially the same height as the interconnections, the sashes provide both a uniform standoff and a seating plane for the LGA connector contacts and connector frames or housings. These features and the uniform Ni underplating and Au overplating resulting from electrolytic surface finishes further ensure tight load distribution of individual contacts. Because the connector frames or housings rest on the sash features, the card surface within the LGA area is mechanically sealed and protected from the entrance of gross level particulate debris. Air turnover in the LGA contact area is also lessened such that the sash also acts as a getter, or buffer zone, reacting with corrosive species outside the functional array field. Thus, the sash acts as an additional protection measure against potential corrosive gas ingress and contact surface deterioration resulting from particulate debris and other environments. The sash could be used alone or in conjunction with an integrated gasket as described in U.S. patent application Ser. No., Docket No. ROC920000212US1 entitled LGA Connector with Integrated Gasket filed Aug. 22, 2001, commonly owned by the assignee herein and incorporated by reference in its entirety. The sash provides a thieving ring to ensure plating uniformity. In some instances, the design prevents overloading of the individual LGA contacts because the height of the sash is the same as the height of the individual contacts, therefore, the downward mechanical pressure will be diverted to the larger continuous surface of the sash rather than the delicate individual pads.

The sash can be created using common etching or printing techniques used for the fabrication of printed circuit boards or other carrier materials, followed by application of suitable surface finish coatings including noble and/or semi-noble platings such as Ni/palladium (Pd)/Au or any other conductive materials using electrolytic or electroless or immersion manufacturing techniques. While described here as Ni/Au, the final sash surface finish may be Pd or as any of the following combinations: Ni/Au by electrolytic deposition; Ni/Au by electroless/immersion; Ni/Au by electroless/ electroless; Ni/Pd/Au by electroless/electroless/immersion techniques. The sash can be on either or both sides of the printed circuit card but preferably is on the side that the connector meets with the interposer. The sash can be created with processing and circuit creation methods known in the art, such as described in Chapter 12: *Printed-Circuit Board Packaging* in *Microelectronics Packaging Handbook*, Tummala, R. and Rymaszewski, E. (eds), Von Nostrand Reinhold, New York, 1989, pp. 853–919.

When using electroless immersion, the sashes may be etched along with the wiring and circuitization using conventional processing techniques. The mask used to define the sash and other features to be plated with the noble/semi-noble finishes preferably should be an immersion mask or otherwise compatible with electroless processing. With electroless immersion processing of the sash, bus bars are not necessarily needed nor electrically connected.

For final plating of electrolytic surface finishes, it is necessary to electrically short the individual surface features such as bussing, the sash, and all the electrical interconnections within an individual chip domain. An important processing step is to electrically connect selected pads to external bussing, including the sash, or short the entire interconnection scheme on the board before masking. To short the entire interconnection scheme to be plated with the final surface finish, it may be preferable not to etch the face of carrier that does not mate with the interposer. The backside then would be covered with the conductive sheet prior to masking, and surface features on the non-mating face of the carrier would be etched in subsequent process steps that complete the final carrier product.

During the manufacturing of the sash and the interconnections, uniform current density during the conductive metal, and subsequent noble/semi-noble surface finish plating operations are provided via presence of large scale metal surface area of the sash. The sash may be added to LGA sites to minimize the variations of the local high surface plating thickness variations around the perimeter and corner LGA pads. With the techniques used above to create the sash, surface plating thickness variability has been reduced three to four times. This enhancement provides tight load distribution on individual LGA interposer contacts and seals the interconnection area as described above.

What is claimed is:

1. A land grid array on a carrier, comprising:
   (a) a plurality of electrical interconnections arranged into an array;
   (b) a electrically conductive sash surrounding the perimeter of the array, the sash having a width defined by an inner edge closest to the array and an outer edge, the width of the sash larger than a frame having a connector to be positioned onto the array, the sash having a height substantially the same height as the plurality of electrical interconnections extending above the plane of the carrier;
   (c) a plurality of electrical connections between the sash and array at selected electrical interconnections; and
   (d) wherein the sash is a voltage path for any of a plurality of other components on the carrier.

2. A land grid array, as in claim 1, wherein the sash further comprises a noble or semi-noble surface finish plating.

3. A land grid array, as in claim 1, wherein the sash is of the same material as the plurality of electrical interconnections.

4. A land grid array, as in claim 1, wherein the sash is electrically connected to a logic ground voltage.

5. A land grid array, as in claim 1, wherein the sash is manufactured simultaneously with the manufacture of the plurality of electrical interconnections.

6. A land grid array, as in claim 2, wherein the noble or semi-noble surface finish plating is made from a pure metal or an alloy from the group consisting of nickel, gold, palladium.

7. A carrier with a land grid array for use with a land grid array interposer connector, the land grid array comprising:
   (a) a multitude of electrical interconnections; and
   (b) an electrically conductive sash surrounding the periphery of the land grid array, said conductive sash comprising;
      (i) placement means for the land grid array interposer to rest upon when placed on top of the land grid array for electrical connection;
      (ii) means to provide a more uniform height and surface finish of the electrical interconnections spanning interior regions of an area toward an outer periphery of the array where the interposer is placed upon the placement means;
      (iii) means to prevent particulate and gaseous contamination of the array of electrical interconnections when an interposer is placed onto the array; and
      (iv) means to provide voltage path for any of a plurality of other components electrically connected to the carrier.

* * * * *